(12) United States Patent
Leu et al.

(10) Patent No.: US 7,301,232 B2
(45) Date of Patent: Nov. 27, 2007

(54) INTEGRATED CIRCUIT PACKAGE WITH CARBON NANOTUBE ARRAY HEAT CONDUCTOR

(75) Inventors: Charles Leu, Fremont, CA (US); Tai-Cherng Yu, Tu-Cheng (TW); Chuan-De Huang, Tu-Cheng (TW); Wen-Jeng Huang, Tu-Cheng (TW); Jhy-Chain Lin, Tu-Cheng (TW); Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 145 days.

(21) Appl. No.: 11/044,953

(22) Filed: Jan. 27, 2005

(65) Prior Publication Data

US 2006/0033203 A1 Feb. 16, 2006

(30) Foreign Application Priority Data

Aug. 13, 2004 (TW) ............................... 93124331 A

(51) Int. Cl.
*H01L 23/34* (2006.01)
*H01L 23/373* (2006.01)
*H01L 23/367* (2006.01)
*H01L 21/02* (2006.01)
*B29C 47/00* (2006.01)

(52) U.S. Cl. ......... 257/712; 257/E23.11; 257/E23.103; 257/E23.145; 257/E23.069; 257/E23.165; 257/E23.107; 257/713; 257/717; 257/720; 257/706; 257/704; 257/707; 264/171.13; 264/108; 264/148; 264/104; 264/437; 264/211; 438/122; 438/125; 427/180

(58) Field of Classification Search .......... 257/E23.11, 257/E23.103, E23.165, E23.107, E23.145, 257/712, 713, 717, 720, 704, 706, 707, 710; 438/122, 125; 264/104, 108, 437, 148, 171.13, 264/211; 427/180
See application file for complete search history.

(56) References Cited

U.S. PATENT DOCUMENTS 6,407,922 B1  6/2002  Eckblad et al. ............. 361/704

(Continued)

FOREIGN PATENT DOCUMENTS

CN  1483668 A  3/2004

(Continued)

OTHER PUBLICATIONS

Berber, Savas et al., "Unusually High Thermal Conductivity of Carbon Nanotubes," *Physical Review Letters*, vol. 84, No. 20, May 15, 2000, pp. 4613-4616.

(Continued)

*Primary Examiner*—Alexander Oscar Williams
(74) *Attorney, Agent, or Firm*—Morris Manning Martin LLP; Tim Tingkang Xia, Esq.

(57) ABSTRACT

An integrated circuit package includes a die mounted on a substrate, an integrated heat spreader set above the die, and an array of carbon nanotubes mounted between the die and the integrated heat spreader. The integrated heat spreader is fixed on the substrate, and includes an inner face. The array of carbon nanotubes is formed on the inner face of the integrated heat spreader. Top and bottom ends of the carbon nanotubes perpendicularly contact the integrated heat spreader and the die respectively. Each carbon nanotube can be capsulated in a nanometer-scale metal having a high heat conduction coefficient.

6 Claims, 4 Drawing Sheets

U.S. PATENT DOCUMENTS

| | | |
|---|---|---|
| 6,994,584 B1 * | 2/2006 | Santana et al. ............. 439/485 |
| 2004/0005736 A1 | 1/2004 | Searls et al. ................ 438/122 |
| 2004/0184241 A1 * | 9/2004 | De Lorenzo et al. ....... 361/719 |
| 2004/0265489 A1 * | 12/2004 | Dubin ........................ 427/212 |
| 2005/0061496 A1 * | 3/2005 | Matabayas, Jr. ............ 165/185 |
| 2005/0255304 A1 * | 11/2005 | Brink ......................... 428/209 |
| 2005/0269726 A1 * | 12/2005 | Matabayas, Jr. ............ 264/104 |
| 2006/0071334 A1 * | 4/2006 | Kawabata et al. .......... 257/741 |
| 2006/0222852 A1 * | 10/2006 | Dubin et al. ................ 428/408 |

FOREIGN PATENT DOCUMENTS

| | | |
|---|---|---|
| CN | 1509794 A | 7/2004 |

OTHER PUBLICATIONS

Fan, Shoushan et al., "Self-Oriented Regular Arrays of Carbon Nanotubes and Their Field Emission Properties," *Science*, vol. 283, Jan. 22, 1999, pp. 512-514.

* cited by examiner

INTEGRATED CIRCUIT PACKAGE WITH CARBON NANOTUBE ARRAY HEAT CONDUCTOR

BACKGROUND OF THE INVENTION

1. Field of the Invention

The invention relates generally to integrated circuit packages and manufacturing methods thereof; and more particularly to a kind of integrated circuit package which conducts heat by using an array of carbon nanotubes, and a manufacturing method thereof.

2. Description of Prior Art

Electronic components such as semiconductor chips are becoming progressively smaller along with the development of semiconductor integrated circuits. The dimensions of electronic packages incorporating such chips are also becoming progressively smaller. Nevertheless, the improved operational performance of these chips means that they operate at unprecedented high temperatures. If the increased heat cannot be effectively dissipated, the integrated circuit may malfunction and may even be damaged. Heat dissipation techniques have become increasingly more important along with the development of semiconductor package technology.

A heat conduction coefficient of the material of a conventional semiconductor package is nowadays often considered too low to satisfactorily dissipate heat produced by the operation of a modern, high-speed integrated circuit chip. The use of low heat conduction coefficient material undesirably increases the temperature of the chip, and ultimately results in failure of the chip. One means to solve this problem is shown in FIG. 5. A package comprises a substrate 3, a die 2, several gold wires 4, and an integrated heat spreader 5. The integrated heat spreader 5 is set over the die 2 and adhered on the substrate 3. The die 2, the gold wires 4 and the integrated heat spreader 5 are packaged by plastic potting material 7. A top side of the integrated heat spreader 5 is exposed to ambient air, to dissipate heat produced by operation of the die 2. Alternatively, a heat dissipation device such as a heat sink can be attached to the top side of the integrated heat spreader 5. However, the heat conducted from the die 2 to the integrated heat spreader 5 must pass through the plastic potting material 7, and the plastic potting material 7 has a low heat conduction coefficient. Therefore, the heat dissipation efficacy of the package is poor.

The discovery of thermal interface materials has lead to their incorporation into the ongoing development of heat dissipation techniques in semiconductor package technology. Referring to FIG. 6, this shows a modification of the means described above in relation to FIG. 5. A thermal interface material 6 is set in thermal contact between a top face of the die 2 and an inner face of the integrated heat spreader 5. When the integrated circuit is working, the heat produced is conducted through the thermal interface material 6 to the integrated heat spreader 5, and is then dissipated to the ambient air. However, the effectiveness of the package is still limited by the heat conduction capability of the thermal interface material.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/mK (watts/milliKelvin) at room temperature. How to apply carbon nanotubes in thermal interface materials for heat dissipation has become an important new field of research.

U.S. Pat. No. 6,407,922 discloses a kind of thermal interface material using carbon nanotubes. The thermal interface material is formed by injection molding, and has a plurality of carbon nanotubes incorporated in a matrix material. A first surface of the thermal interface material engages with an electronic device, and a second surface of the thermal interface material engages with a heat sink. The second surface has a larger area than the first surface, so that heat can be uniformly spread over the larger second surface. However, the thermal interface material formed by injection molding is relatively thick. This increases a bulk of the thermal interface material and reduces its flexibility. Furthermore, the carbon nanotubes are disposed in the matrix material randomly and multidirectionally. This means that heat does not spread uniformly through the thermal interface material. In addition, heat does not necessarily spread directly from the first surface of the thermal interface material engaged with the electronic device to the second surface of the thermal interface material engaged with the heat sink.

U.S. Pat. Pub. No. 2004/0005736 discloses another thermal interface material comprising an array of carbon nanotubes, and a semiconductor package using a layer of the thermal interface material. The thermal interface material layer is set between a semiconductor chip and a thermal management aid. The thermal management aid is an integrated heat spreader or a heat sink. The array of carbon nanotubes is encapsulated in a matrix of interstitial material. A substantial portion of the nanotubes have a length slightly exceeding the thickness of the interstitial material, to allow the nanotubes to be wedged between the chip and the thermal management aid. This enables heat to be conducted from the chip primarily through the nanotubes, rather than through the surrounding interstitial material.

However, the thermal interface material formed by encapsulating an array of carbon nanotubes in a matrix of interstitial material cannot sufficiently use the heat conduction capability of carbon nanotubes, because of the low heat conduction coefficient of the matrix. In addition, asymmetric radiation of heat from the chip can result in asymmetric heat conduction, and further reduce the efficiency of the thermal interface material. Furthermore, the array of carbon nanotubes needs to be formed on the chip prior to the fabrication of active circuits on the chip, in order to avoid exposing active chip elements to the high temperatures involved in the process of forming the nanotubes. This makes the fabrication of active circuits on the chip problematic.

An integrated circuit package which overcomes the above-mentioned problems and a method for manufacturing such package are desired.

BRIEF SUMMARY OF THE INVENTION

Accordingly, an object of the present invention is to provide an integrated circuit package having excellent heat conduction.

Another object of the present invention is to provide a method for conveniently manufacturing the above-described integrated circuit package.

To achieve the first of the above-mentioned objects, an integrated circuit package in accordance with a preferred embodiment of the present invention comprising a die mounted on a substrate, an integrated heat spreader set above the die, and an array of carbon nanotubes mounted between the die and the integrated heat spreader. The integrated heat spreader is fixed on the substrate, and includes an outer face and an inner face. The array of carbon nanotubes is formed on the inner face of the integrated heat spreader. Top and bottom ends of the carbon nanotubes perpendicularly contact the integrated heat spreader and the die respectively. Each of the carbon nanotubes can be capsulated in a nanometer-scale metal having a high heat conduction coefficient.

To achieve the second of the above-mentioned objects, a method for manufacturing the integrated circuit package comprises the steps of:
(a) providing a substrate comprising two opposite surfaces;
(b) forming a die on one surface of the substrate;
(c) providing an integrated heat spreader comprising an inner face and an outer face;
(d) forming an array of carbon nanotubes on the inner face of the integrated heat spreader, wherein each carbon nanotube can be capsulated in a nanometer-scale metal having a high heat conduction coefficient;
(e) fixing the integrated heat spreader on the substrate while at the same time the integrated heat spreader is set above the die;
(f) packaging the substrate, the die and the integrated heat spreader; and
(g) welding solder balls on the other surface of the substrate.

The method of step(d) further comprises the steps of:
(a2) polishing the inner face of the integrated heat spreader;
(b2) depositing a patterned catalyst layer on the inner face of the integrated heat spreader;
(c2) gasifying a graphite rod comprising a metal element by laser ablation, to obtain carbonaceous gas containing the metal element;
(d2) conveying the carbonaceous gas to the inner face of the integrated heat spreader, the carbonaceous gas being carried by argon, the argon being at a pressure of about 500 torr; and
(e2) cooling the integrated heat spreader to thereby obtain thereon the carbon nanotubes capsulated in the nanometer-scale metal.

Unlike in a conventional integrated circuit package, the array of carbon nanotubes is directly formed on the bottom surface of the integrated heat spreader before packaging. Thus, the high temperatures needed for forming the carbon nanotubes cannot damage or destroy the die. In addition, each carbon nanotube can provide a heat conduction path in a direction perpendicular to the die and the integrated heat spreader. In a further embodiment, each of carbon nanotubes can provide a heat conduction path in a direction perpendicular to the integrated heat spreader and a heat-dissipating device attached above the integrated heat spreader. These configurations efficiently utilize the high heat conductivity of carbon nanotubes. Moreover, the array of carbon nanotubes capsulated in a nanometer-scale metal having a high heat conduction coefficient can dissipate heat uniformly for asymmetric heat radiation of the chip. This can improve the efficiency and stability of heat dissipating.

Other objects, advantages and novel features of the invention will become more apparent from the following detailed description when taken in conjunction with the accompanying drawings, in which:

DESCRIPTION OF THE PREFERRED EMBODIMENTS

Figure 1:
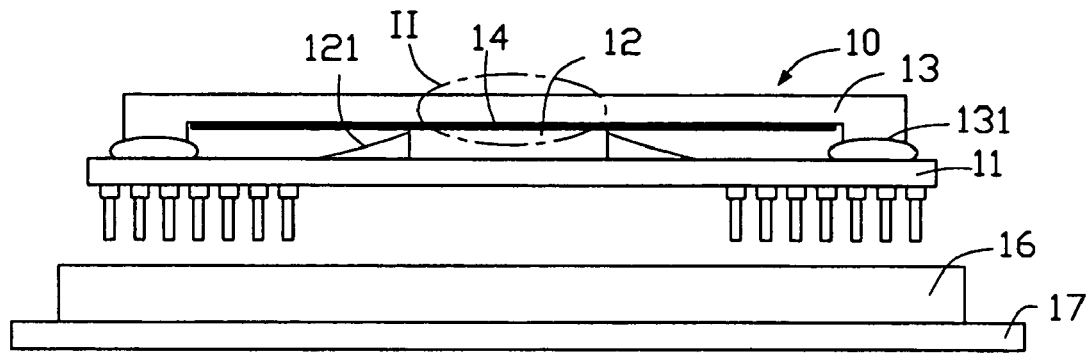
FIG. 1 is a schematic, side cross-sectional view of an integrated circuit package using an array of carbon nanotubes as a thermal interface material in accordance with the present invention, the thermal interface material being sandwiched between a die and an integrated heat spreader, and the integrated circuit package being shown above a connector mounted on a motherboard.
Figure 2:
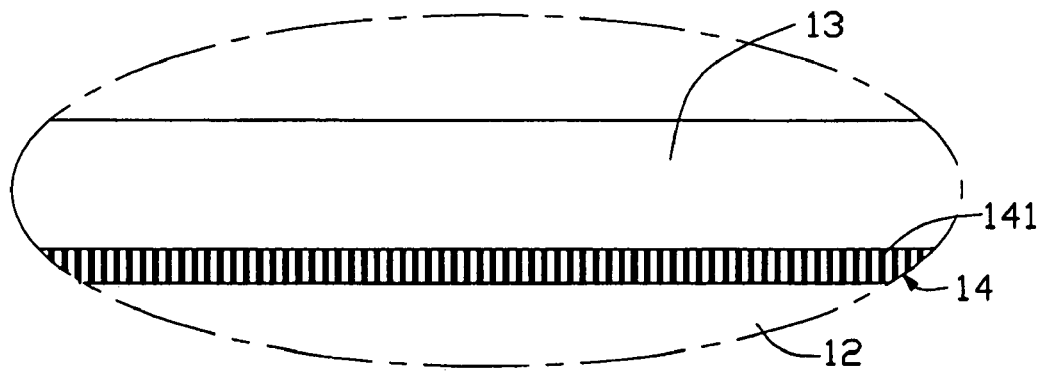
FIG. 2 is an enlarged view of a marked elliptical portion of FIG. 1, showing an array of carbon nanotubes directionally formed between the die and the integrated heat spreader.

Referring to FIGS. 1 and 2, an integrated circuit package 10 in accordance with the present invention comprises a substrate 11, a die 12 mounted on the substrate 11, an integrated heat spreader 13 set above the die 12, and an array of carbon nanotubes 14 mounted between the die 12 and the integrated heat spreader 13. The die 12 is electrically connected with a circuit of the substrate 11 by gold wires 121. The integrated heat spreader 13 comprises an inner face and an outer face. A standoff portion 131 of the integrated heat spreader 13 is adhered on the substrate 11, and is electrically connected to a ground potential of the substrate 11. The integrated heat spreader 13 can airproof and protect the die 12, while at the same time eliminate electromagnetic interference. The array of carbon nanotubes 14 is directly formed on the inner face of the integrated heat spreader 13, and acts as a thermal interface material. The array of carbon nanotubes 14 comprises a plurality of carbon nanotubes 141 that are uniformly spaced apart and parallel to each other. Top and bottom ends of the carbon nanotubes 141 perpendicularly contact the integrated heat spreader 13 and the die 12 respectively, in order to provide direct heat conduction paths between the die 12 and the integrated heat spreader 13. A height of the array of carbon nanotubes 14 can be controlled by controlling a growth time of the carbon nanotubes 141 during their manufacture, which is described in more detail hereinbelow. The height of the array of carbon nanotubes 14 is generally in the range from 10 to 100 micrometers. In the preferred embodiment of the present invention, each carbon nanotube 141 is capsulated in a nanometer-scale metal having a high heat conduction coefficient. This can improve the stability and efficiency of heat conduction. The nanometer-scale metal comprises nanometer-scale copper.

In addition, the substrate 11 can be electrically connected with a motherboard 17 by a connector 16, so that the substrate 11 connects with other electrical components.

Figure 3:
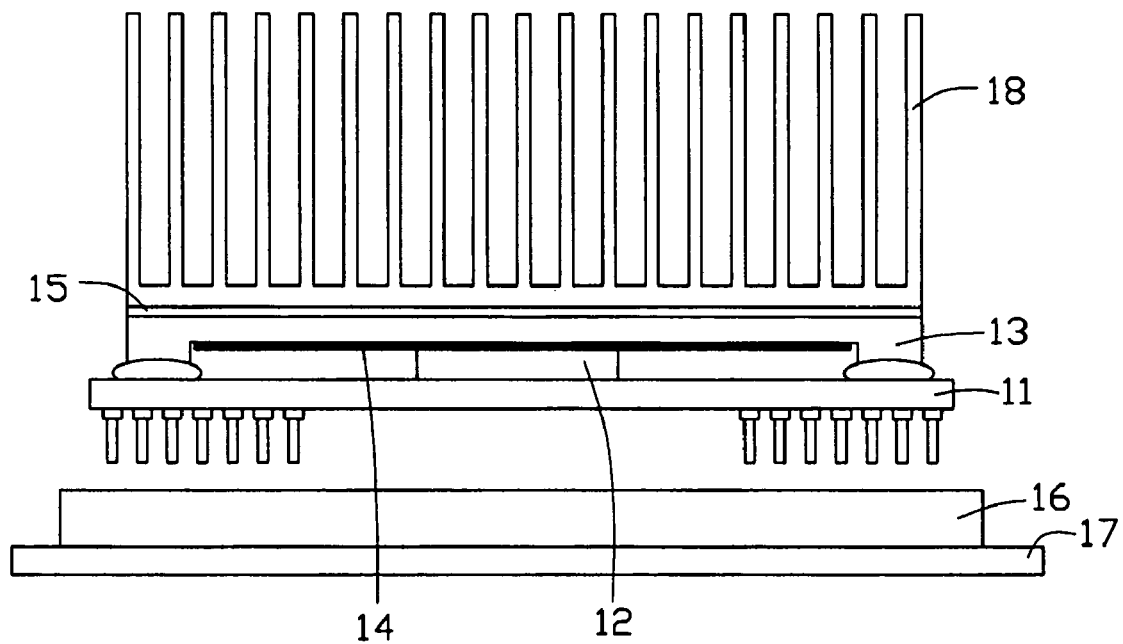
FIG. 3 is similar to FIG. 1, but also showing another array of carbon nanotubes used as another thermal interface material, the other array of carbon nanotubes being sandwiched between the integrated heat spreader and a heat sink.

Referring to FIG. 3, in a further embodiment of the present invention, an array of carbon nanotubes 15 is formed on the outer face of the integrated heat spreader 13. Each of the carbon nanotubes 15 can be capsulated in a nanometer-scale metal having a high heat conduction coefficient. The array of carbon nanotubes 15 can conduct heat from the integrated heat spreader 13 to an outer heat-dissipating device 18, whereupon the heat is dissipated to ambient air. In the illustrated embodiment, the outer heat-dissipating device 18 is a fin heat sink.

Figure 4:
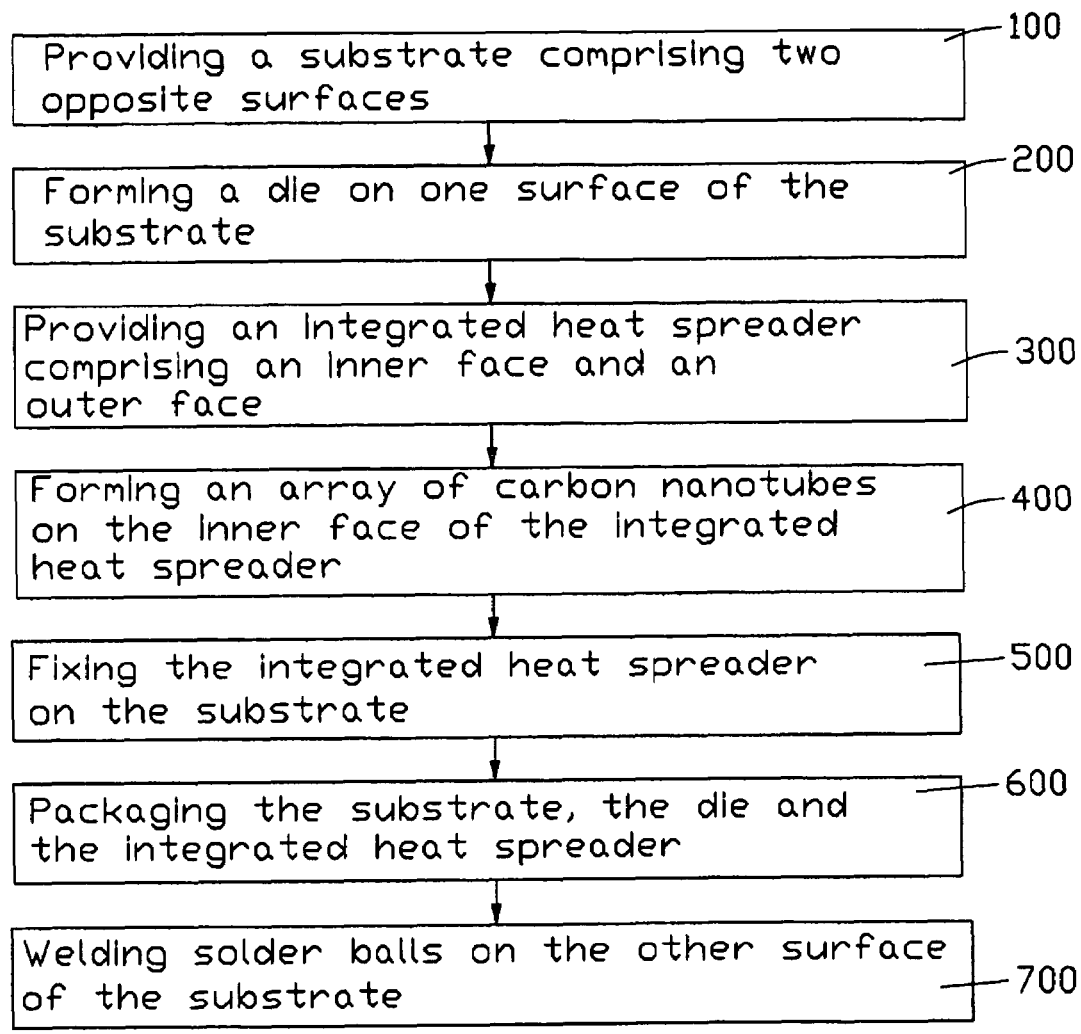
FIG. 4 is a flow chart for manufacturing the integrated circuit package in accordance with the present invention.
Figure 5:
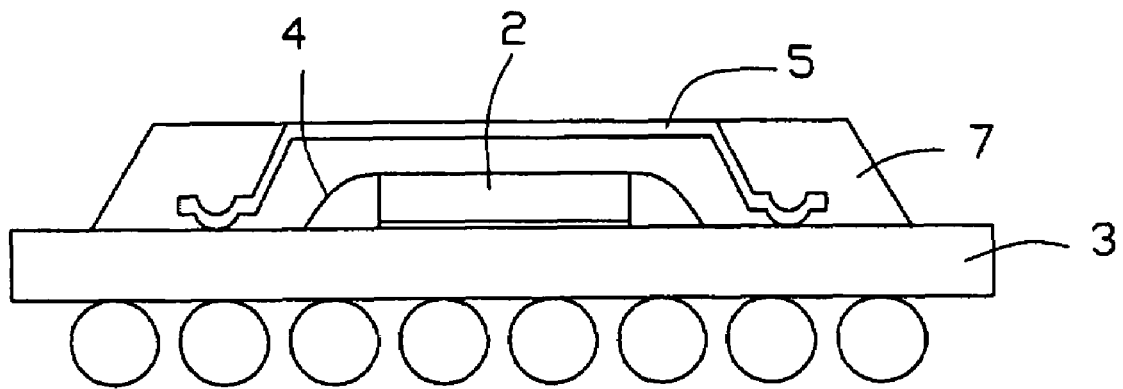
FIG. 5 is a schematic, side cross-sectional view of a conventional integrated circuit package, the package comprising a die and an integrated heat spreader, and the package having solder balls attached to an underside thereof.
Figure 6:
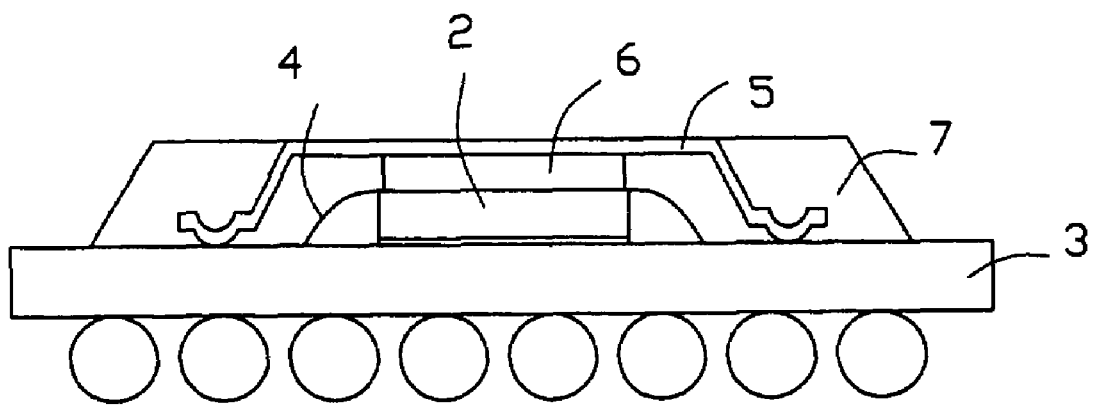
FIG. 6 is similar to FIG. 5, but showing a conventional thermal interface material sandwiched between the die and the integrated heat spreader.

FIG. 4 is a flow chart for manufacturing the integrated circuit package 13 in accordance with the present invention. The method comprises the following steps:

Step 100 is providing a substrate comprising two opposite surfaces.

Step 200 is forming a die on one surface of the substrate, and electrically connecting a circuit of the substrate to the die by gold wires.

Step 300 is providing an integrated heat spreader comprising an inner face and an outer face. The integrated heat spreader is made of copper.

Step 400 is forming an array of carbon nanotubes on the inner face of the integrated heat spreader. A height of the array of carbon nanotubes is in the range from 10 to 100 micrometers. This step is described in more detail hereinbelow.

Step 500 is fixing the integrated heat spreader on the substrate. The integrated heat spreader is set above the die. Top and bottom ends of the carbon nanotubes perpendicularly contact the integrated heat spreader and the die respectively.

Step 600 is packaging the substrate, the die and the integrated heat spreader. This is performed by way of molding or vacuum printing.

Step 700 is welding solder balls on the other surface of the substrate, to electrically connect the substrate to a connector, which in turn can electrically connect with a connector on a motherboard.

Further, an array of carbon nanotubes can be formed on the outer face of the integrated heat spreader, in similar fashion to the method described above in step 400. Bottom and top ends of the carbon nanotubes perpendicularly contact the integrated heat spreader and an outer heat-dissipating device respectively.

Still further, each carbon nanotube can be capsulated in a nanometer-scale metal having a high heat conduction coefficient. This can improve the stability and efficiency of heat conduction. The nanometer-scale metal can be nanometer-scale copper.

In step 400, the method for forming the array of carbon nanotubes on the integrated heat spreader is as follows. Firstly, the integrated heat spreader is polished by a chemical mechanical polishing process, and is then cleaned. As a result, a roughness of the integrated heat spreader is in the range from 5 to 10 angstroms.

Secondly, a catalyst film (not shown) is uniformly deposited on the surface of the integrated heat spreader by thermal disposition, electron-beam disposition, or sputtering. The catalyst film can be made of iron (Fe), cobalt (Co), nickel (Ni), or an alloy thereof. In the preferred method, the catalyst film is made of iron, and has a thickness of 10 nanometers.

Finally, the catalyst film is oxidized by annealing under 300° C. in air, thereby obtaining catalyst particles. The integrated heat spreader with the catalyst particles disposed thereon is placed in a reaction furnace. A carbon source gas is introduced into the reaction furnace at a temperature of 350-1000° C. to grow the array of carbon nanotubes. The carbon source gas can be acetylene or ethene. The flow rate of the carbon source gas is in the range from 800 to 1000 stand and cubic centimeters per minute (SCCM). A height of the array of carbon nanotubes can be controlled by controlling the growth time thereof. The height of the array of carbon nanotubes is generally in the range from 10 to 100 micrometers. In the preferred method, a diameter of each carbon nanotube is about 20 nanometers, the height of each carbon nanotube is about 50 micrometers, and each space between adjacent carbon nanotubes is about 100 nanometers. Further details of the method for growing the array of carbon nanotubes can be found in pages 512-514, Vol. 283, Science 1999, and in pages 11502-11503, Vol. 123, J. Am. Chem. Soc. 2001.

In an alternative method for step 400, the carbon nanotubes capsulated in nanometer-scale metal are formed on the integrated heat spreader as follows. Firstly, the surface of the integrated heat spreader is polished by a chemical and mechanical polishing process to ensure that a roughness of the integrated heat spreader is in the range from 5 to 10 angstroms.

Secondly, a patterned catalyst film is deposited on the surface of the integrated heat spreader. This is done by forming a patterned photoresist on the surface of the integrated heat spreader by pre-baking, aligning and developing in that order, and then forming the patterned catalyst layer by sputtering or evaporation deposition. The catalyst film can be made of iron (Fe), cobalt (Co), nickel (Ni), or an alloy thereof. In the preferred method, the catalyst film is made of iron, and a thickness of the catalyst film is 10 nanometers.

Thirdly, a graphite rod comprising a metal element is gasified by a laser to obtain carbonaceous gas containing the metal element. In a preferred method, the laser is a neodymium doped yttrium aluminum garnet (Nd YAG) laser, and the metal element is copper. The content of nanometer-scale metal in the carbonaceous gas is not less than 1% by weight.

Fourthly, the carbonaceous gas is carried by flowing argon to the surface of the integrated heat spreader. The argon is at a pressure of 500 torr.

Finally, the integrated heat spreader is cooled, and the carbon nanotubes capsulated in nanometer-scale metal are thus formed.

Unlike in a conventional integrated circuit package, in the present invention, the array of carbon nanotubes 14 is formed on the surface of the integrated heat spreader 13 directly before packaging. Thus, the high temperature needed for forming the carbon nanotubes 141 cannot damage or destroy the die 12. Furthermore, each carbon nanotube 141 provides a heat conduction path in a direction perpendicular to the die 12 and the integrated heat spreader 13. In the case where the array of carbon nanotubes 15 is employed, each carbon nanotube provides a heat conduction path in a direction perpendicular to the integrated heat spreader 13 and the outer heat-dissipating device 18. These configurations make full use of the high heat conduction capabilities of the carbon nanotubes. In addition, the array of carbon nanotubes 141 capsulated in nanometer-scale metal can help dissipate heat asymmetrically radiated from the chip. This improves the efficiency and reliability of heat dissipation.

It is understood that the above-described embodiments and methods are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. An integrated circuit package comprising:
   a substrate;
   a die mounted on the substrate;
   an integrated heat spreader set above the die; and an array of carbon nanotubes mounted between the die and the integrated heat spreader;

wherein the integrated heat spreader is fixed on the substrate, the integrated heat spreader includes an inner face, the array of carbon nanotubes is formed on the inner face of the integrated heat spreader, top and bottom ends of the carbon nanotubes perpendicularly contact the integrated heat spreader and the die respectively, and each of the carbon nanotubes is capsulated in a nanometer-scale metal having a high heat conduction coefficient.

2. The package as claimed in claim 1, further comprising another array of carbon nanotubes formed on an outer face of the integrated heat spreader, wherein bottom ends of the carbon nanotubes perpendicularly contact the integrated heat spreader, and top ends of the carbon nanotubes are adapted to perpendicularly contact a heat-dissipating device.

3. The package as claimed in claim 1, wherein a height of the array of carbon nanotubes is in the range from 10 to 100 micrometers.

4. The package as claimed in claim 1, wherein the nanometer-scale metal comprises nanometer-scale copper.

5. The package as claimed in claim 1, wherein the integrated heat spreader is made of copper.

6. The package as claimed in claim 2, wherein the heat-dissipating device comprises a fin heat sink.

* * * * *